(12) United States Patent
Neff et al.

(10) Patent No.: US 6,967,341 B2
(45) Date of Patent: Nov. 22, 2005

(54) METHOD AND DEVICE FOR THE GENERATION OF FAR ULTRAVIOLET OR SOFT X-RAY RADIATION

(75) Inventors: Willi Neff, Kelmis (BE); Klaus Bergmann, Herzogenrath (DE); Oliver Rosier, Jüchen (DE); Joseph Pankert, Aachen (DE)

(73) Assignees: Fraunhofer-Gesellschaft zur Förderung der angewandten Forschung e.V., München (DE); Philips Corporate Intellectual Property GmbH, Hamburg (DE); Koninklijke Philips Electronics N.V., Eindhoven (NL)

( * ) Notice: Subject to any disclaimer, the term of this patent is extended or adjusted under 35 U.S.C. 154(b) by 109 days.

(21) Appl. No.: 10/473,906

(22) PCT Filed: Mar. 21, 2002

(86) PCT No.: PCT/DE02/01017

§ 371 (c)(1),
(2), (4) Date: Oct. 3, 2003

(87) PCT Pub. No.: WO02/082871

PCT Pub. Date: Oct. 17, 2002

(65) Prior Publication Data

US 2005/0040347 A1    Feb. 24, 2005

(30) Foreign Application Priority Data

Apr. 6, 2001 (DE) .............. 101 17 378
Jul. 12, 2001 (DE) .............. 101 34 033

(51) Int. Cl.$^7$ .............................. H05G 2/00
(52) U.S. Cl. .............. 250/504 R; 378/119; 315/111.21
(58) Field of Search .................. 250/504 R, 493.1, 250/492.1, 492.2; 378/34, 119; 315/111.21

(56) References Cited

U.S. PATENT DOCUMENTS 4,596,030 A * 6/1986 Herziger et al. .......... 378/119
5,023,897 A * 6/1991 Neff et al. ................. 378/119
6,300,720 B1 * 10/2001 Birx ..................... 315/111.21

* cited by examiner

Primary Examiner—Jack I. Berman
(74) Attorney, Agent, or Firm—Gudrun E. Huckett

(57) ABSTRACT

In a method for generating extreme ultraviolet radiation or soft x-ray radiation by means of gas discharge, in particular, for EUV lithography, a discharge vessel is provided with two electrodes that are connected to high voltage. Between the electrodes, in an area of two electrode recesses that are coaxial to one another, a gas fill with predetermined gas pressure in accordance with a discharge operation realized on the left branch of the Paschen curve is provided. In this area, a plasma emitting the radiation is generated when supplying energy. The plasma is displaced or deformed by a pressure change of the gas fill in the area of the electrode recesses.

19 Claims, 3 Drawing Sheets

METHOD AND DEVICE FOR THE GENERATION OF FAR ULTRAVIOLET OR SOFT X-RAY RADIATION

BACKGROUND OF THE INVENTION

Figure 1:
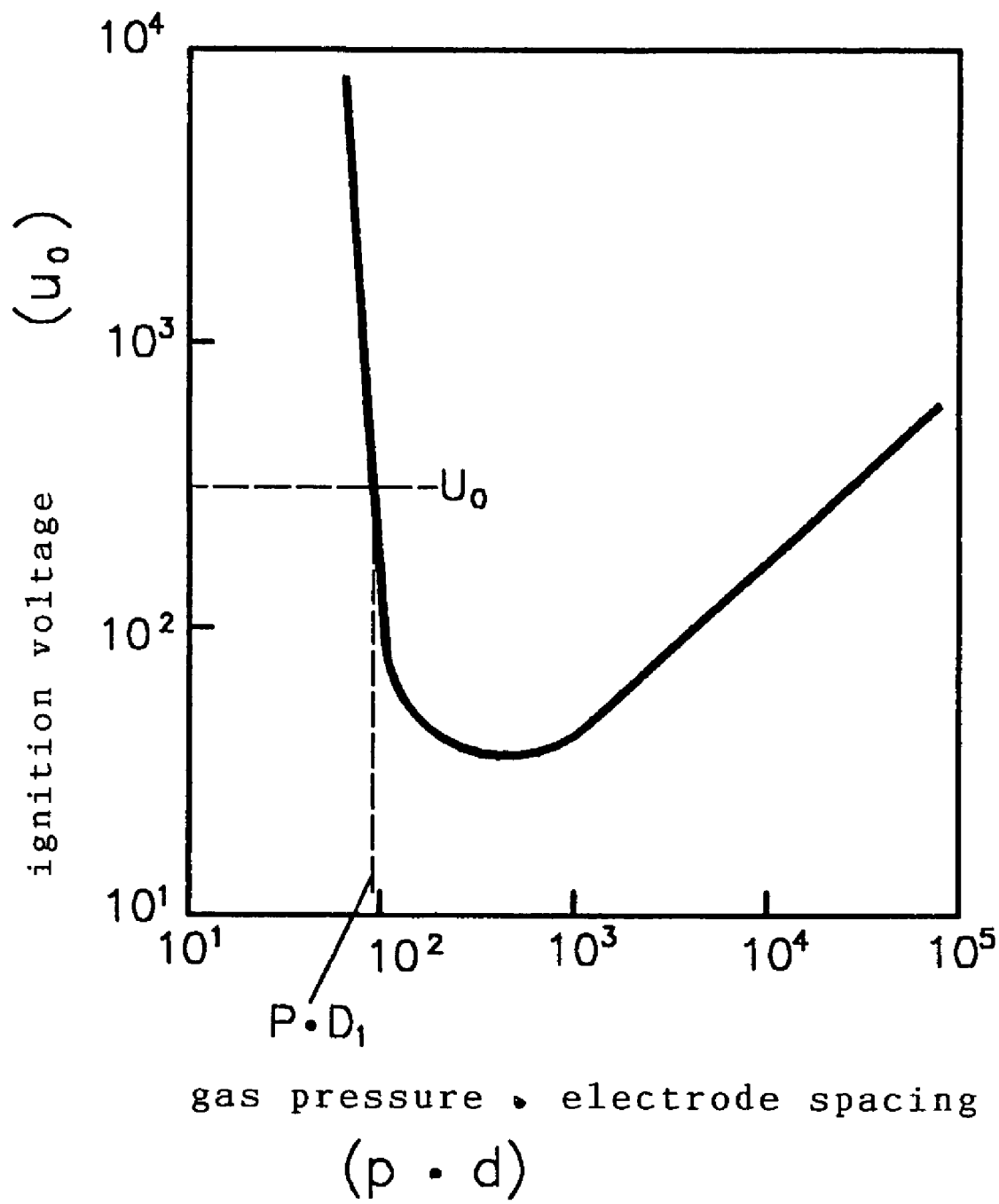

The invention relates to a method for generating extreme ultraviolet/soft x-ray radiation by means of gas discharge, in particular, for EUV lithography, wherein in a discharge vessel two electrodes are connected to high voltage, between which in an area of two electrode recesses that are coaxial to one another a gas fill with predetermined gas pressure in accordance with a discharge operation realized on the left branch of the Paschen curve is provided, in which a plasma emitting the radiation is formed when supplying energy.

Preferred fields of application for the extreme ultraviolet (EUV) radiation or the soft x-ray radiation in the range of approximately 1 nm to 20 nm wavelength are particularly the EUV lithography. WO 99/29145 discloses a method having the features of the aforementioned kind. The device used in this method is comprised of an anode with a central bore recess and an oppositely positioned hollow cathode. The device operates in an environment of constant gas pressure. For generating EUV radiation, gases of the elements of the atomic number Z>3 are preferred, for example, Xe with broadband emission characteristics. When high voltage is employed, gas firing occurs depending on the pressure and the electrode distance. The pressure of the gas and the electrode distance are selected such that the system operates on the left branch of the Paschen curve and, as a result of this, no dielectric firing between the electrodes occurs. Only in the vicinity of the hollow cathode the field lines are sufficiently extended so that the firing conditions are fulfilled above a certain voltage. A current-conducting plasma channel of axially symmetrical shape is then formed between the electrodes in accordance with the electrode recess. The electrical circuit connected to the device is configured such that a very high discharge current occurs when the current-conducting channel is generated. This current generates a magnetic field about the current path. The resulting Lorentz force constricts the plasma. It has been known for a long time that this constriction effect can cause the plasma to be heated to very high temperatures and can generate radiation of very short wavelength. It has been demonstrated that the device can generate EUV light (10 to 20 nm) very effectively, that it enables high repetition frequencies, and has a moderate electrode wear.

The plasma emitting in the short-wave range is produced along an axis of symmetry in the area of the hollow cathode and past the recess of the anode, depending on the provided conditions. Relevant parameters for a geometry of the plasma are derived from the shape of the electrodes, as well as parameters of a supplied electrical current, its duration, its shape, and its amplitude, as well as the gas pressure conditions and the composition of the gas of the gas fill in the discharge vessel or in the area of the electrodes.

The known method results in a pinch, i.e., in a plasma channel that should be shorter and whose radiation should be able to be decoupled from the electrode system in a better way.

SUMMARY OF THE INVENTION

Accordingly, it is an object of the invention to improve a method having the aforementioned features such that the decoupling action of the radiation from the electrodes is improved and in that an optimized plasma geometry results, i.e., an emission area that is shorter axially.

The aforementioned object is solved in that the plasma is displaced and/or deformed by means of a pressure gradient of the gas fill in the area of the electrode recesses.

It is important for the invention that a pressure gradient of the gas fill is used in order to displace and/or deform the pinch or the plasma. These measures result in an improvement of the decoupling action of the radiation from the electrodes, for example, in a focusing device of an EUV lithography station. The displacement of the plasma can be carried out such that it is optically excellently accessible, i.e., shading occurs as little as possible, even when observing at large observation angles, relative to the axis of symmetry. Also, an optimal adaptation of the light throughput of the radiation source, i.e., of the plasma, to the optical system can be obtained. The light throughput is determined by the product of the effective surface of the plasma and the flare angle. In principle, a light throughput as minimal as possible is desired, i.e., a point source, so that utilization of large proportions of the light emitted into the half-space is ensured. In the context of the source geometry of an electrode discharge that is present here, the problem is reduced substantially to a plasma that is emitting axially as short as possible and for which essentially no radiation shading losses should occur.

The method can be described in more detail in connection with an adaptation of an EUV light source to an optical device of an EUV lithography station. The EUV light source can be used in a semiconductor lithography device of the next generation for which a light source with a main wavelength of approximately 13.5 nm is required. In addition to the requirement in regard to the wavelength, there are strict requirements with respect to the light source format of the light-emitting area and with respect to the total output which must be provided by the source. In both respects, the known method is limited in its output. Firstly, because the geometry of the electrodes enables only a limited access of the light-emitting area and the rest of the light is wasted on the surrounding walls. Secondly, an axial-symmetrical geometry always forms a stretched plasma which cannot be effectively concentrated. Typical lengths are currently 3 to 10 mm while the focusing optics can process only light source formats of approximately 2 mm and below.

The method can be modified in such a way that one of the electrodes is configured as a hollow cathode in which and/or in front of which, relative to its environment, an overpressure of the gas fill is generated. With a hollow cathode, the formation of the electrical field that is formed in the area of the electrode recesses between the electrodes can be influenced. By means of the bore hole area of the hollow cathode the field lines can be configured to be sufficiently stretched in order to fulfill the firing conditions for a predetermined voltage so that the system operates in the area of the left branch of the Paschen curve. Since the generated electrical discharge depends, in addition to its dependency on the electrode spacing and on the shape of the electrodes, also on the gas pressure of the gas fill, it is advantageous to generate in front of the electrode an overpressure of the gas fill relative to its environment. The overpressure causes the long field lines to extend in the areas of reduced gas pressure so that higher field strengths for the electrical firing results. As a result of this, the plasma generated in the case of a firing will be displaced because of the pressure gradient. The displacement can be realized in an area of improved accessibility with reduced shading.

It is preferred that the gas of the gas fill is introduced via the hollow cathode whose electrode recess is used as a starting point for building up a pressure drop. The starting point of the pressure drop and thus of the desired pressure gradient is thus the area of the electrode recess of the hollow cathode that is neighboring the anode. Correspondingly, a displacement of the plasma away from the electrode recess of the hollow cathode takes place.

A further improvement, in particular, of the afore described embodiment, can be achieved in that a nozzle is employed with which gas of the gas fill is blown in at high speed into the discharge vessel causing displacement of the plasma. In this configuration, an additional control parameter is provided which enables shaping of the isobaric lines in front of the electrode recess of the cathode. In particular, it is possible to move the pinch area of the plasma still father outwardly; this has advantages with regard to cooling of the device with which the method is being carried out, in particular, in the area of the electrodes.

The method can be improved in that, in addition to the gas that forms the plasma, a process-affecting filling gas is introduced into the discharge vessel. With the filling gas not only a gradient formation with regard to the gas fill in the discharge vessel can be obtained but also further process effects are possible. For example, the reabsorption of EUV radiation by means of the primary gas used for the gas discharge can be minimized. This problem is particularly dramatic when xenon is used as a discharge gas because xenon reabsorbs EUV radiation particularly strongly. A further advantage can be that the filling gas is used in order to extinguish the discharge faster than the discharge gas in order to achieve a higher repetition rate.

Particularly advantageously the method is carried out such that the filling gas flows into the discharge vessel in a tubular shape surrounding the gas that forms the plasma. With the aid of the filling gas, a very effective encompassing shaping of the discharge gas can be achieved in this way.

The invention also relates to a device for generating extreme ultraviolet radiation/x-ray radiation by means of gas discharge, in particular, for EUV lithography, comprising two electrodes connected to high voltage arranged within a discharge vessel, which electrodes in an area of two electrodes recesses that are coaxial to one another have a gas fill of a predetermined aas pressure in accordance with discharge operation on the left branch of the Paschen curve, in which a plasma emitting the radiation is generated when energy is supplied. The device has the same disadvantages as described above with respect to the method so that for the device the same object applies as described above in connection with the method. This object is solved in that the gas pressure of the gas fill is higher near an electrode configured as a cathode than in an area of the discharge vessel remote therefrom.

The formation of a higher gas pressure near an electrode embodied as a cathode relative to an area remote from this electrode results in a corresponding pressure gradient and, in particular, in a pressure drop. A result of this pressure drop is a displacement of the plasma that is being formed in the sense of an excellent accessibility and reduced optical shading with regard to an optical device for processing the light.

One embodiment of the afore described device is expediently designed such that the cathode is embodied as a hollow cathode through which the gas of the gas fill can be introduced into the discharge vessel. The hollow cathode has the stretched field lines described above whose formation is a prerequisite in order to arrive at suitable conditions for the left branch of the Paschen curve. At the same time, by means of the hollow cathode, the gas of the gas fill, i.e., the discharge gas or primary gas, is introduced into the discharge vessel. This provides a simple constructive configuration because a particular configuration of spaces acting as a gas supply line is not required in this situation of using the hollow space of the hollow cathode for the purpose of gas introduction.

The nozzle can be used in different ways. Advantageously, the device is configured such that the electrode recess and/or the central bore are configured as a nozzle and/or in that, by means of the nozzle, a gas flow can be generated that is oriented toward the hollow cathode. The afore described embodiments can also be used in particular in combination with one another.

A further embodiment of the device can be realized in that the electrode recess of the cathode has a nozzle that affects the feed velocity of the gas forming the plasma and/or the gas distribution. The nozzle can be configured such that a significant displacement of the plasma into an area of excellent optical accessibility is enabled.

Moreover, it may be advantageous when the cathode is surrounded at a spacing by the electrode forming the anode such that an annular space is formed and that the electrode recess of the anode is configured to open conically. In this situation, a concentric electrode arrangement is enabled which is characterized by a special freedom with regard to the accessibility of the space into which the plasma is to be displaced. The optical accessibility can be further improved; the conical opening of the electrode recess of the anode contributes particularly to this effect. Even for greater observation angles relative to the common electrode axis, a reduced shading results, and, in the case of a short plasma, it appears to be approximated more closely to the ideal of a point source even at greater observation angles.

The device can be configured such that by means of the annular space present between the cathode and the anode a filling gas can be introduced into the discharge vessel. The filling gas can affect the pressure generation of the discharge gas and therefore can contribute to the displacement and shaping of the plasma. The annular space present between the cathode and the anode results in a corresponding symmetrical configuration of the area of the discharge vessel that is supplied with the filling gas. In the case of rotational symmetry of the electrodes, this filling gas area is accordingly of rotational symmetry.

When the filling gas is a gas that reabsorbs extreme ultraviolet radiation and/or a gas that extinguishes a plasma, reabsorption of extreme ultraviolet radiation and/or the repetition frequency can be affected. In pulse operation a faster course of the repeating discharge processes is possible, this results in an improved light efficiency.

Minimization of the consumption of discharge gas results when the device is configured such that the discharge vessel is filled outwardly in the area of the electrodes mainly with the filling gas.

Moreover, it can be advantageous to configure the device such that the aspect ratio of diameter to depth of the recess of the cathode is smaller than one. In this way, not only the gas consumption is minimized and the gas flow is aligned so that a correspondingly large displacement of the plasma in the flow direction of the discharge gas results, but also a contribution is provided in that current transport across the wall of the recess of the cathode and the wall of the hollow cathode and thus a weakening of the plasma is suppressed as much as possible.

BREIF DESCRIPTION OF THE DRAWINGS

Figure 2:
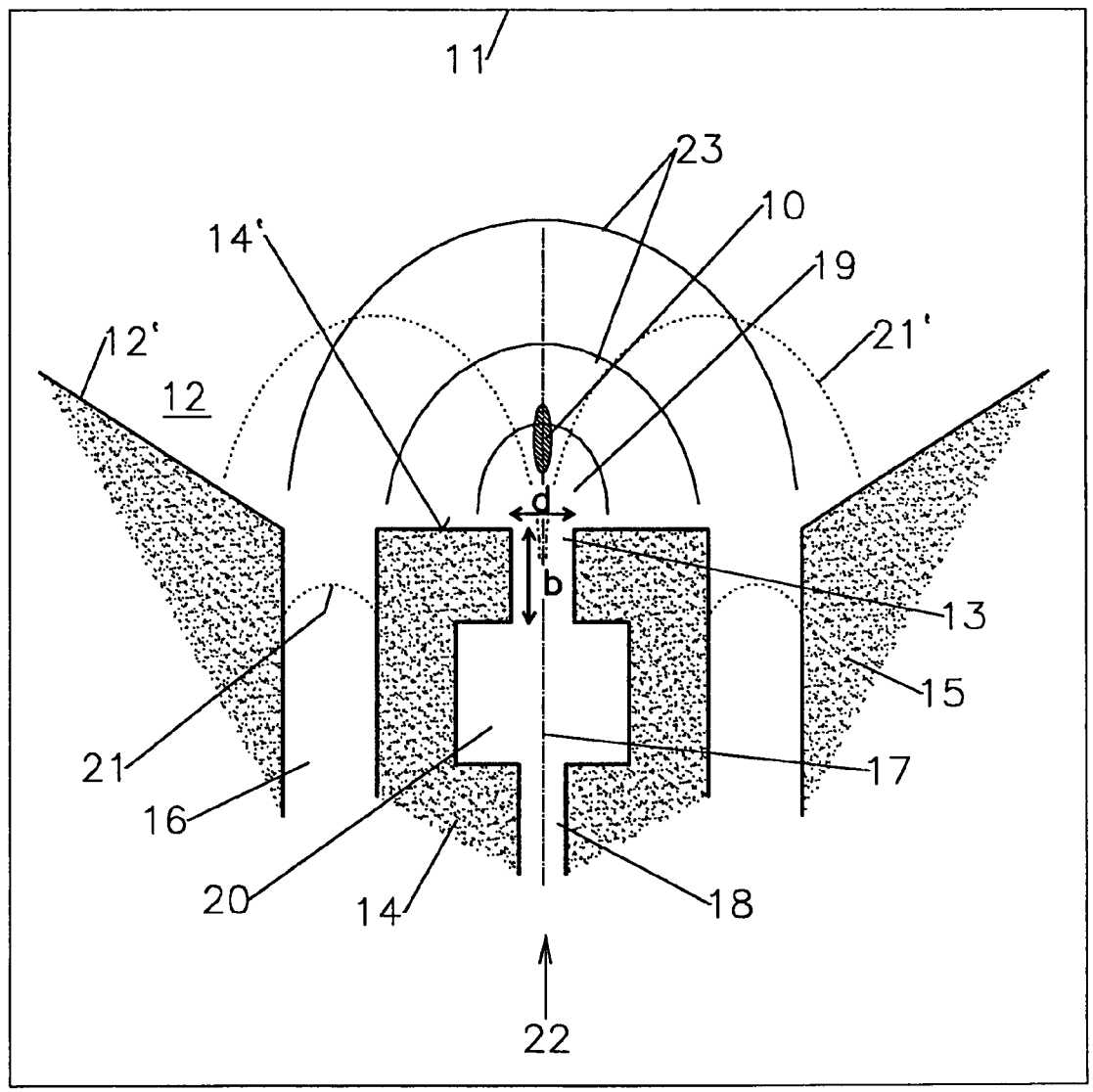

The invention will be explained with the aid of the drawing. It is shown in:

FIG. 1 a diagram of the dependency of the ignition voltage from the product of gas pressure and electrode spacing;

FIG. 2 in a schematic illustration a first electrode arrangement; and

Figure 3:
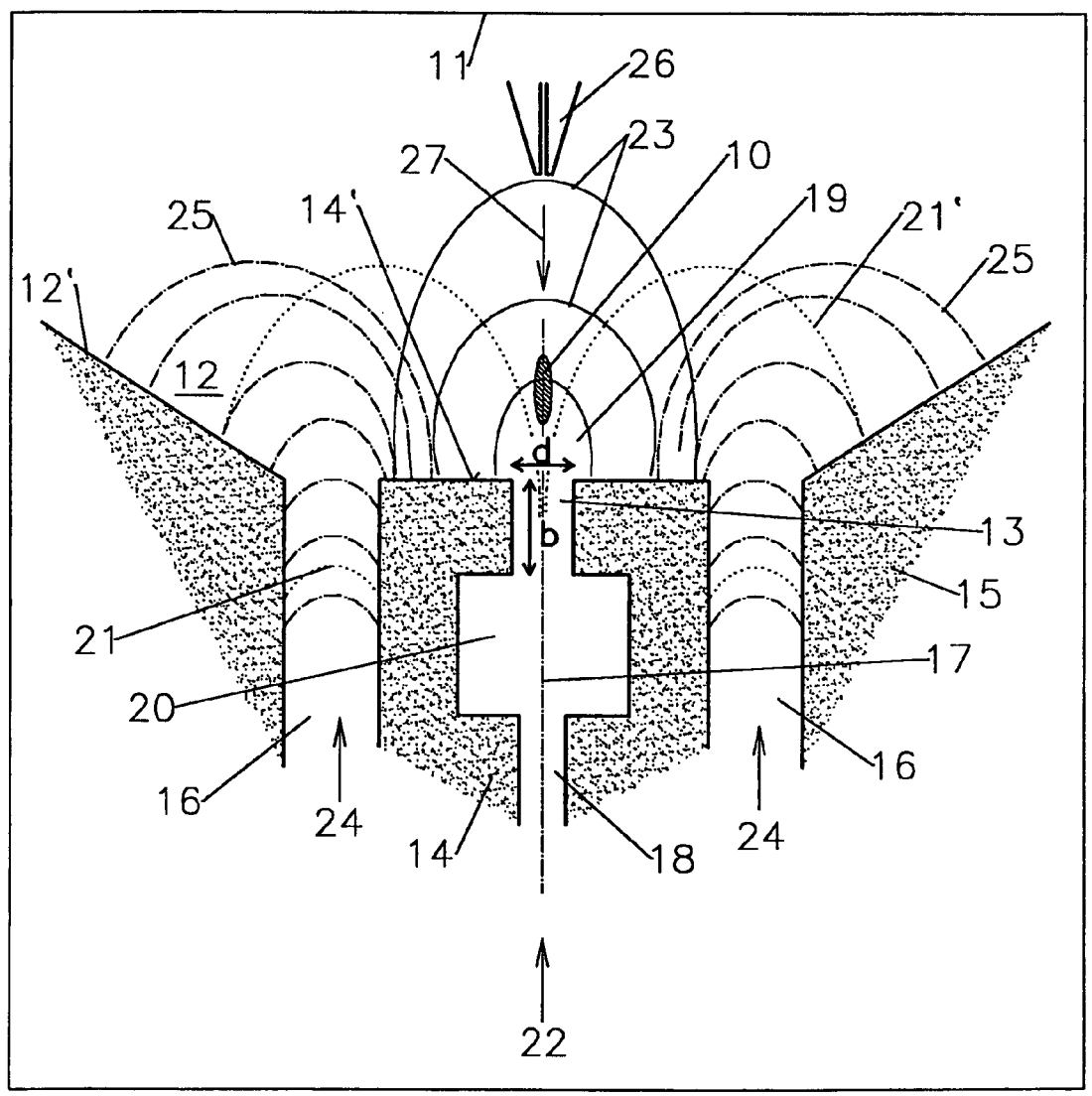

FIG. 3 in a schematic illustration the electrode arrangement of FIG. 2 in a different operating mode.

DESCRIPTION OF REFERRED EMBODIMENTS

FIG. 1 illustrates Paschen's Law, i.e., a dependency of the ignition voltage as a determining factor for gas discharges $U_0$ from the product of gas pressure p and electrode spacing d. The voltage $U_0$ is that voltage where automatically gas discharge occurs for a gas discharge path formed between two electrodes. The law applies for a certain electrode geometry and a certain gas. FIG. 1 clarifies that the radiation-generating method is to be carried out according to the left branch of the Paschen curve, i.e., with a gas discharge where the generation of the plasma is realized in several steps by means of secondary ionization processes by automatic firing and where the plasma distribution is highly cylindrically symmetrical already in the starting phase. Energy can be introduced into the plasma, i.e., by means of a pulsed current that is provided by a current source. By a suitable selection of the amplitude and of the period duration of the current pulses, the suitable temperature of the plasma for light emission can be adjusted. The period durations are within the two-digit or three-digit nanosecond range. During one pulse, the plasma, as a result of the Lorentz force, is constricted, and this results in a so-called pinch.

FIGS. 2, 3 show pinch arrangements of schematically illustrated electrodes. The electrodes are configured to have rotational symmetry relative to the axis of symmetry 17. The arrangement of the electrodes is concentric. This axis of symmetry 17 is at the same time a center axis of an electrode embodied as a hollow cathode 14. The hollow cathode 14 has a central bore 18 with an electrode recess 13 within a mouth area 19 of the central bore 18, wherein this mouth area 19 is a component of an electrode recess 20 of an additional electrode 15 embodied as an anode. The anode 15 is also of rotational symmetry and surrounds the hollow cathode 14 so that an annular space 16 is formed. Both electrodes are arranged in a discharge vessel 11 that is filled with discharge gas whose pressure is less than that of atmospheric pressure.

A characteristic feature of the electrode recess is the configuration of the hollow cathode 14 that has a cavity 20 in the vicinity of the electrode recess 13 that significantly widens the diameter of the central bore 18. In this way, a special configuration of the field lines 21 is achieved such that, for example, the field lines 21' extend into the hollow space 20 and thus generate a field that extends in good approximation parallel to the axis of symmetry 17. When the voltage is increased sufficiently, upon reaching the ignition voltage $U_0$ either an automatic firing occurs that results in the formation of a plasma or, shortly beforehand, a triggered gas discharge is generated. The gas discharge is generated in the vicinity of the hollow cathode 14 in front of its end face 14' or in front of the electrode recess 13 because here the concentration of the electrical field is greatest and the field strength decreases toward the anode 15 since it has a conically opening electrode recess 12 where the recess wall 12' together with the axis of symmetry 17 forms an acute angle up to a 90 degree angle. The conical recess wall 12' of the electrode recess 12 is arranged relative to the hollow cathode 14 such that the smallest recess diameter of the anode 15 (i.e., the bottom of the electrode recess 12), which is identical to the outer diameter of the annular space 16 provided between the electrodes, is arranged at the level of the end wall 14' of the hollow cathode 14.

The central bore 18 is formed as a gas inlet 22. Via the gas inlet 22 the discharge gas is introduced through the central bore 18 into the cavity 20 and can flow from here through the electrode recess 13 of the hollow cathode 14 into the electrode recess 12 of the anode and into the discharge vessel where vacuum is maintained. The pressure of the discharge gas can drop already within the hollow cathode 14. In any case, starting at the electrode recess 13 a pressure drop can be generated. FIG. 2 shows isobaric lines 23 of decreasing pressure. As a result of the resulting pressure gradient of the gas fill, the plasma 10 is displaced in the direction away from the cathode. The displacement is realized as a result of the symmetrical configuration of the electrical field and the gas pressure distribution in the direction of the axis of symmetry 17.

The amount of displacement of the plasma 10 depends on the dimensions of the electrode recess 13 and of the flow velocity of the gas. For example, the electrode recess 13 can be configured as a nozzle with which the gas of the gas fill is blown at high speed into the discharge vessel 11. The arrangement of the plasma 10 in the electrode recess 12 can be changed largely in that suitable electrical and aerodynamic conditions are selected. In particular, in the described configuration of the anodes it can be achieved that the plasma 10 no longer has a cylindrical geometry but, corresponding to the illustration, is concentrated in a reduced, more egg-shaped volume. Simultaneously with the displacement, a deformation of the plasma 10 takes place that is advantageous with regard to optical considerations.

The above discussions also hold true for the configuration of FIG. 3. Here, the special feature is illustrated that the annular space 16 provided between the electrodes is used as a gas inlet 24. For example, a filling gas 25 is used that flows, as a result of the annular or tubular configuration of the annular space 16, in a correspondingly tubularly shaped flow surrounding the gas that forms plasma 10 into the discharge vessel 11. This filling gas 25 has a shaping effect on the gas forming the plasma. FIG. 3 shows in comparison to FIG. 2 the constricting effect of the filling gas 25, shown in dash-dotted lines, onto the gas forming the plasma and thus onto its isobaric lines 23. Also, with the aid of the filling gas it is thus possible to create pressure changes within the plasma-generating gas which, in turn, cause displacements and/or shaping of the plasma 10.

FIG. 3 shows a nozzle 26 with which gas supply of a discharge gas to the front sides of the electrodes can be realized. The exit velocity of the gas must be high enough in order to generate, according to arrow 27, a gas flow oriented toward the hollow cathode 14. By means of the gas flow, in front of the end face 14' of the hollow cathode 14 a higher pressure is generated which drops greatly corresponding to the isobaric lines 23 relative to the background.

The afore described configuration of the electrodes for pinch shaping via inhomogeneous pressure conditions of the gas contained within the discharge vessel 11, in particular, of the gas present in front of the end face 14' of the hollow cathode, can be supplemented by means of predetermined sizing of the electrode recess 13. In particular, it is advantageous to configure the electrode recess 13 as a cathode opening such that the aspect ratio of diameter d to depth b is <1. This results not only in a more uniform flow of the gas when it is supplied through the electrode recess 13 into the discharge vessel 11, but also allows affecting the transport of the charge carriers for the plasma. In particular, the current transport via the electrode recess 13 and via the wall of the hollow cathode forming the cavity 20 is suppressed as much as possible. This also improves the generation of the plasma 10 in an area of the electrode recess 12 where an excellent optical accessibility is provided, i.e., without shading of the plasma even at greater observation angles relative to the axis of symmetry 18.

What is claimed is:

1. A method for generating a radiation of extreme ultraviolet range or soft x-ray range by gas discharge, the method comprising the steps of:
    arranging a first electrode and a second electrode concentrically surrounding the first electrode in a discharge vessel, wherein the first electrode is a hollow cathode having an electrode recess and wherein the second electrode has an electrode recess that is coaxial to the electrode recess of the hollow cathode;
    connecting the first and second electrodes to high voltage;
    introducing a discharge gas through the hollow cathode to provide a gas fill between the first and second electrodes in an area of the electrode recesses, wherein the gas fill has a predetermined gas pressure in accordance with a discharge operation realized on a left branch of the Paschen curve;
    generating in front of the hollow cathode from the discharge gas exiting from the hollow cathode a plasma emitting the radiation when supplying high voltage;
    displacing or deforming the plasma by providing a pressure gradient of the gas fill in front of the hollow cathode.

2. The method according to claim 1, further comprising the step of generating in the hollow cathode or in front of the hollow cathode an overpressure of the gas fill relative to an environment of the hollow cathode.

3. The method according to claim 2, further comprising the step of generating a pressure drop of the gas fill beginning at the electrode recess of the hollow cathode.

4. The method according to claim 3, further comprising the step of arranging a nozzle in the discharge vessel and blowing a gas of the gas fill at high speed into the discharge vessel and causing a displacement of the plasma.

5. The method according to claim 1, further comprising the step of introducing, in addition to the discharge gas, a process-affecting filling gas into the discharge vessel.

6. The method according to claim 5, wherein, in the step of introducing the filling gas, the filling gas flows in a tubular shape surrounding the discharge gas forming the plasma into the discharge vessel.

7. A device for generating a radiation of extreme ultraviolet range or soft x-ray range by gas discharge, the device comprising:
    a discharge vessel;
    a first electrode and a second electrode concentrically surrounding the first electrode, the first and second electrodes connected to high voltage and arranged within the discharge vessel;
    wherein the first electrode is a hollow cathode having an electrode recess and wherein the second electrode has an electrode recess that is coaxial to the electrode recess of the hollow cathode;
    wherein the hollow cathode has a gas inlet through which a discharge gas is supplied to create a gas fill between the electrode recesses, wherein the gas fill has a predetermined gas pressure in accordance with a discharge operation on the left branch of the Pasehen curve, wherein in front of the hollow cathode from the discharge gas exiting from an end face of the hollow cathode a plasma emitting the radiation is generated when high voltage is supplied;
    wherein the gas pressure of the gas fill is higher near the hollow cathode for displacing or deforming the plasma.

8. The device according to claim 7, wherein the hollow cathode has a first nozzle.

9. The device according to claim 8, wherein the first nozzle is configured to increase a supply speed of the discharge gas of the gas fill.

10. The device according to claim 9, wherein the first nozzle is configured to affect a distribution of the discharge gas of the gas fill.

11. The device according to claim 8, wherein the first nozzle is configured to affect a distribution of the discharge gas of the gas fill.

12. The device according to claim 8, wherein at least one of the electrode recess of the hollow recess and a central bore of the hollow cathode forms the nozzle.

13. The device according to claim 8, further comprising a second nozzle arranged in the discharge vessel and configured to guide a gas flow toward the hollow cathode.

14. The device according to claim 7, further comprising a nozzle arranged in the discharge vessel and configured to guide a gas flow toward the hollow cathode.

15. The device according to claim 7, wherein the second electrode is an anode and wherein the anode surrounds the hollow cathode at a spacing so as to form an annular space between the hollow cathode and the anode, wherein the electrode recess of the anode widens conically and wherein a bottom of the electrode recess of the anode is positioned at a level of the end face of the hollow cathode.

16. The device according to claim 15, wherein a filling gas is introduced into the discharge vessel via the annular space.

17. The device according to claim 16, wherein the filling gas is a gas reabsorbing extreme ultraviolet radiation or a gas extinguishing the plasma.

18. The device according to claim 16, wherein the discharge vessel is filled outwardly in the area of the first and second electrodes mainly with the filling gas.

19. The device according to claim 7, wherein an aspect ratio of a diameter of the electrode recess of the hollow cathode relative to a depth of the electrode recess of the hollow cathode is smaller than one.

* * * * *